United States Patent
Makosiej et al.

(10) Patent No.: US 10,861,520 B2
(45) Date of Patent: Dec. 8, 2020

(54) SRAM/ROM MEMORY RECONFIGURABLE BY SUPPLY CONNECTIONS

(71) Applicant: COMMISSARIAT A L'ENERGIE ATOMIQUE ET AUX ENERGIES ALTERNATIVES, Paris (FR)

(72) Inventors: Adam Makosiej, Grenoble (FR); David Coriat, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/510,235

(22) Filed: Jul. 12, 2019

(65) Prior Publication Data

US 2020/0020373 A1 Jan. 16, 2020

(30) Foreign Application Priority Data

Jul. 13, 2018 (FR) ...................... 18 56515

(51) Int. Cl.
| | |
|---|---|
| G11C 11/00 | (2006.01) |
| G11C 7/20 | (2006.01) |
| G11C 11/412 | (2006.01) |
| G11C 11/418 | (2006.01) |

(52) U.S. Cl.
CPC .............. *G11C 11/005* (2013.01); *G11C 7/20* (2013.01); *G11C 11/412* (2013.01); *G11C 11/418* (2013.01)

(58) Field of Classification Search
CPC ... G11C 11/005; G11C 11/412; G11C 11/418; G11C 7/20
See application file for complete search history.

(56) References Cited

U.S. PATENT DOCUMENTS

| | | |
|---|---|---|
| 5,040,143 A | 8/1991 | Matsumura et al. |
| 5,365,475 A | 11/1994 | Matsumura et al. |
| 6,426,890 B1 | 7/2002 | Jasinski et al. |
| 7,358,764 B1 | 4/2008 | Chan et al. |
| 8,630,139 B2 * | 1/2014 | Braceras ................ G11O 5/147 365/203 |

(Continued)

OTHER PUBLICATIONS

U.S. Appl. No. 16/510,263, filed Jul. 12, 2019, David Coriat, et al.

(Continued)

*Primary Examiner* — Toan K Le
(74) *Attorney, Agent, or Firm* — Oblon, McClelland, Maier & Neustadt, L.L.P.

(57) ABSTRACT

Memory device provided with a set of memory cells having a first inverter and a second inverter each connected to a supply line from a first supply line and a second supply line, the memory device being provided with a circuit element configured for:

during a start-up phase consecutive to a powering on, applying a first pair of potentials, respectively to the first supply line and the second supply line, in order to pre-load a logic data to some cells depending on the manner in which said cells are respectively connected to said supply lines, then during a second phase, applying a second pair of potentials respectively to said first supply line and the second supply line, so as to symmetrically supply the inverters of each cell.

16 Claims, 9 Drawing Sheets

(56) References Cited

U.S. PATENT DOCUMENTS

| | | | |
|---|---|---|---|
| 2007/0139996 A1* | 6/2007 | Ozawa | G11C 11/412 365/154 |
| 2009/0296497 A1* | 12/2009 | Hirabayashi | G11C 8/08 365/189.09 |
| 2015/0302917 A1* | 10/2015 | Grover | H01L 27/0207 365/51 |
| 2018/0211702 A1* | 7/2018 | Hanson | G11C 11/412 |
| 2018/0268890 A1 | 9/2018 | Gupta et al. | |
| 2019/0080761 A1 | 3/2019 | Makosiej et al. | |

OTHER PUBLICATIONS

French Preliminary Search Report dated May 21, 2019 in French Application 18 56515 filed on Jul. 13, 2018 (with English Translation of Categories of Cited Documents).
Dongsoo Lee et al., "Area Efficient ROM-Embedded SRAM Cache", IEEE Transactions on Very Large Scale Integration (VLSI) Systems, vol. 21, No. 9, Sep. 2013, 13 pages.
U.S. Appl. No. 16/248,832, filed Jan. 16, 2019, Makosiej, A., et al.
European Office Action dated Jan. 3. 2020 in European Application No. 19186098.0, 8 pgs.

* cited by examiner

FIG.10C

SRAM/ROM MEMORY RECONFIGURABLE BY SUPPLY CONNECTIONS

TECHNICAL FIELD AND PRIOR ART

The invention relates to the field of Static Random Access Memories (SRAM), and more specifically relates that of memories, provided with cells having a SRAM structure, and also likely to integrate a Read-Only Memory (ROM) function or an NVM memory, that is to say a non-volatile memory.

In this field, document U.S. Pat. No. 5,365,475 presents a memory cell having a SRAM structure with 6 identical transistors, using an additional supply line and an additional ground line, to be used, via a fixed polarization of the transistors thereof, as a ROM memory cell. The behaviour in conventional ROM or SRAM mode of the cell is fixed, during the manufacture of the memory, by choosing the manner in which same is connected to the supply lines and ground lines.

Moreover, in order to perform the start-up thereof, a digital system uses data that are typically stored in a space of a ROM memory. Once said start-up has been performed, during the operation of the system, said ROM memory space is generally unused.

The document "Area Efficient ROM-Embedded SRAM Cache", by Dongsoo Lee et al., IEEE Transactions on VLSI systems, vol. 21, no. 9, 2013 presents a memory formed from SRAM cells suitable for operating according to a conventional SRAM memory mode during which the cells are available for read and write access, and also may adopt another operating mode during which same are read-only. The change from one mode to the other is achieved using an additional word line of which the biasing is modified. Said additional word line requires a substantial modification of the control circuits external to the matrix of cells, and in particular of the controller of word lines and of the associated control logic.

Therefore, the problem arises of finding a new memory device provided with a ROM memory functionality and which is improved with respect to the disadvantages mentioned hereinabove, in particular which is reconfigurable or reusable, with a reduced size, and does not require a substantial modification of external control circuits.

BRIEF DESCRIPTION OF THE DRAWINGS

The present invention will be better understood upon reading the description of examples of embodiments given, purely for the purposes of information and in no way limiting, in reference to the accompanying drawings wherein.

Identical, similar or equivalent portions of different figures bear the same numerical references in order to facilitate passing from one figure to the other.

The various portions shown on the figures are not necessarily shown according to a uniform scale, in order to make the figures more legible.

DESCRIPTION OF THE INVENTION

One embodiment of the present invention provides a memory device provided with:
a set of memory cells, each memory cell of said set comprising:
a first node and a second node,
a first inverter and a second inverter connected in a manner crossed between said first node and said second node,
the memory device further comprising:
a first supply line connected to one of a first transistor of the first inverter and a second transistor of the second inverter,
a second supply line connected to the other of said first transistor of the first inverter and said second transistor of the second inverter, the second supply line being distinct from the first supply line,
the memory device being provided with a circuit configured for, during an initialisation sequence:
during a first phase, applying a first pair of potentials, respectively to the first supply line and the second supply line, so as to impose on the cells of said set, pre-load logic data the respective values of which depend on the supply line from said first and second supply lines to which the first transistor thereof and the second transistor thereof are respectively connected, then
during a second phase, applying a second pair of potentials respectively to said first supply line and the second supply line, the second pair of potentials being different from the first pair of potentials and provided so as to keep said pre-load logic data and make the cells of said set readable and writeable, The cells of said set are thus pre-loaded automatically due to the sequence of potentials applied to the first supply line and the second supply line, according to respective values that depend on the respective arrangements thereof in relation to the first supply line and the second supply line.

The arrangement of each cell in relation to the supply lines and the pre-loaded data value associated to said arrangement are typically determined during the design of the device. Said pre-load data may thus consist of data from a ROM or NVM memory or a ROM or NVM memory code that is automatically imposed on the set of cells following the initialisation sequence.

Thus, without necessarily having to modify the internal line decoder of the memory and whilst limiting the size thereof, said circuit makes it possible to use the cells of said set as ROM or NVM memory cells, then, once the data of the ROM or NVM memory are read, to use said cells as cells of a SRAM memory operating conventionally.

Such a pre-loading of cells is also of importance for applications other than same indicated above. For example, such a pre-loading may be used for protecting the memory device in relation to unauthorised reading. For example, the memory device may detect the implementation of unauthorised reading and when such reading is detected, the initialisation sequence may be implemented in order to rapidly erase the content of the memory cells.

Advantageously, the initialisation sequence may be consecutive to a powering on of a system wherein the memory device is integrated.

Thus, the circuit for establishing the initialisation sequence defined above may be configured for:
  during the first phase, applying the first pair of potentials by powering on the first supply line without supplying the second supply line, then, after a predetermined delay in relation to the start of the first phase,
  according to the second phase, applying the second pair of potentials by keeping powered on the first supply line whilst powering on the second supply line, the first supply line and the second supply line being able to then be set at the same potential.

According to a first possibility of implementation, such a circuit may comprise:
  a first circuit portion and a second circuit portion each receiving a supply voltage VDD,
  a first switch element, typically provided with at least one transistor, between the first portion and the first supply line, suitable for alternately disconnecting then connecting the first circuit portion to the first supply line following a change of state of a first control signal,
  a second switch element, typically provided with at least one other transistor, arranged between the second portion and the second supply line, suitable for alternately disconnecting then connecting the second circuit portion to the second supply line following a change of state of a second control signal, the change of state of the second control signal being delayed, according to said predetermined delay, in relation to the change of state of the first control signal.

According to a second possibility of implementation, such a circuit may comprise:
  a first portion and a second portion each receiving a supply voltage VDD,
  at least one first buffer circuit between the first portion and the first supply line,
  at least one second buffer circuit between the second portion and the second supply line, said first buffer having a current gain different from same of the second buffer.

According to a third possibility of implementation, such a circuit may comprise:
  a first portion connected to the first supply line and to a node receiving a voltage supply VDD,
  a second portion connected to said node, at least one delay cell being disposed between the second portion and the second supply line.

In addition, two neighbouring memory cells of said set of memory cells share a first common connection area with one of said first supply line or second supply line chosen according to the desired value of the pre-load logic data to be imposed on one of the two neighbouring memory cells of said set during the first phase of the initialisation sequence. Indeed, given that two neighbouring memory cells share a common connection area with one of the first and second supply lines, it is therefore possible to choose the pre-load value that will be imposed on one of the two neighbouring memory cells by choosing the supply line (the first or the second) that will be coupled to the first transistor of the first inverter, the other supply line being coupled to the second transistor of the second inverter. For the other of the two neighbouring memory cells, there is in this case two possibilities:
  either the first transistor of the first inverter and the second transistor of the second inverter of said other of the two neighbouring memory cells are both coupled to the supply line that is coupled to the first common connection area, which means that the pre-load value cannot be imposed for said other of the two neighbouring memory cells (as for a conventional SRAM cell);
  or the first transistor of the first inverter and the second transistor of the second inverter of said other of the two neighbouring memory cells are coupled to the two supply lines in a manner opposite to said one of the two neighbouring memory cells (if the first inverter of the first cell is coupled to the first supply line and the second inverter of the first cell is coupled to the second supply line, then the first inverter of the second cell is coupled to the second supply line and the second inverter of the second cell is coupled to the first supply line, or even when the first inverter of the first cell is coupled to the second supply line and the second inverter of the first cell is coupled to the first supply line, then the first inverter of the second cell is coupled to the first supply line and the second inverter of the second cell is coupled to the second supply line), which means that the pre-load value imposed for said other of the two neighbouring memory cells is not chosen independently of same chosen for said one of the two neighbouring memory cells.

Although said configuration only makes it possible to choose the pre-load value for only one of the two memory cells that have a common connection area, same has the advantage of not increasing the surface area occupied by the memory cells, as opposed to the case where the pre-load values of each of the memory cells are chosen independently of the other memory cells (which cannot be obtained with a common connection area).

Typically, the device includes at least one first cell of said set having the first inverter thereof connected to the first supply line and the second inverter thereof connected to the second supply line and at least one other cell having the first inverter thereof connected to the second supply line and the first inverter thereof connected to the second supply line. In this case, said other cell stores an additional value data of same stored by the first cell.

The memory device may also include another cell having the two inverters thereof connected to a same given supply line from said first supply line and second supply line. In this case, said other cell is polarized as a conventional SRAM cell immediately after the initialisation sequence.

One embodiment thus provides that the set of cells may include a second neighbouring cell of the first cell and having the two inverters thereof connected to a same given supply line from said first supply line and second supply line, the first cell and the second cell sharing a first common connection area connected to said given supply line. Such a common connection area makes it possible to reduce the size and may make it possible to produce the various connections to the supply lines in a standard manufacturing technology.

The set of cells includes at least a third cell situated on a same column of cells as the first cell and the second cell so that the second cell is situated between the first cell and the third cell, the third cell having one of the inverters thereof connected to the first supply line and another of the inverters thereof connected to the second supply line. Thus, the third cell is pre-loadable and may be used as ROM or NVM memory cell.

The third cell may be a neighbouring cell of the second cell and share with the second cell a second common connection area, the second common connection area being connected to the first supply line when the first common connection area is connected to the first supply line or even, the second common connection area being connected to the second supply line when the first common connection area is connected to the second supply line.

Alternatively, the third cell may be a neighbouring cell of the second cell and may share with the second cell a second common connection area, the second common connection area being coupled to the first supply line when the first common connection area is coupled to the second supply line or even the second common connection area being coupled to the second supply line when the first common connection area is coupled to the first supply line. Said configuration may be advantageous when the memory cells have two by two symmetrical designs, which makes it possible to apply a same pre-load value to all of the memory cells being located in such a configuration.

The set of cells may be provided with at least one fourth cell disposed on a same column of cells as the first cell, the second cell and the third cell, the fourth cell having inverters connected to the second supply line.

Advantageously, the memory device according to the invention may be provided with a first sector including said set of cells, in other words with cells that can function as pre-loadable RAM cells and likely to thus adopt the operating mode previously described, and a second sector including memory cells used only as conventional SRAM cells.

Said second sector may consist of SRAM cells provided with inverters connected to a same supply line from the supply lines LVDD1, LVDD2 or receiving a same supply potential during the first phase and during the second phase, or connected arbitrarily for pre-loading the arbitrary values of which are not used during the reading of the ROM or NVM memory.

Advantageously, said set of cells belongs to a matrix plane arranged in columns and in horizontal rows (alternately even and odd) of cells. Therefore, the memory device is advantageously configured so that one horizontal row out of two of cells constitutes a ROM or NVM memory following the previously described initialisation phase.

In this case, when the first cell belongs to an odd horizontal row of cells, other cells of said set belonging to other odd rows are also pre-loadable.

Alternatively, when the first memory cell belongs to an even horizontal row of cells, other cells of said set belonging to other even rows are also pre-loadable.

In order to enable the accession of the cells that are successively used as ROM or NVM memory then RAM memory cells, the memory device may further comprise a module for converting virtual memory addresses into physical memory addresses. Such a conversion module may be used notably when the cells that are used as ROM or NVM memory are not successively arranged next to one another.

Said conversion module may be provided with an offset module configured for:

during an access to a pre-loaded cell, typically during the restart of a circuit, detecting an indicator signal of a first type of memory access (ROM) relative to an access to the read-only memory cells of said set, and to consequently apply a first type of offset operation to a virtual address in order to produce a physical address, then, during a SRAM access, typically after restart or boot of the system, detecting an indicator signal of a second type of memory access (RAM), relative to an access to the readable and writeable memory cells of said set, and to consequently apply a first type of offset operation to a virtual address in order to produce a physical address, the second type of offset operation being different from said first type of offset operation.

The first type of offset operation may be provided so as to restrict the access only to the even horizontal rows of said horizontal rows of said set of cells or to restrict the access only to the odd horizontal rows of said horizontal rows of said set of cells, whereas the second type of offset operation is likely to give access to all of the horizontal rows of said set of cells.

The conversion module may include a decoder configured for:

from a virtual address, producing an indicator signal of a first type of relative memory access or an indicator signal of a second type of memory access, transmitting said virtual address to the offset module.

It may be provided to integrate the set of cells, said offset module, and advantageously the decoder on a same support.

In all cases, it is possible that the initialisation sequence is only applied to one or certain columns of memory cells of the device. For this, it is possible that the memory device is provided with one or more switches arranged upstream of the column or columns in order to control the coupling or not of the memory cells with the supply lines.

The memory device may be used notably as cache memory of which some columns may be re-initialised.

DETAILED DESCRIPTION OF SPECIFIC EMBODIMENTS

Figure 1A:
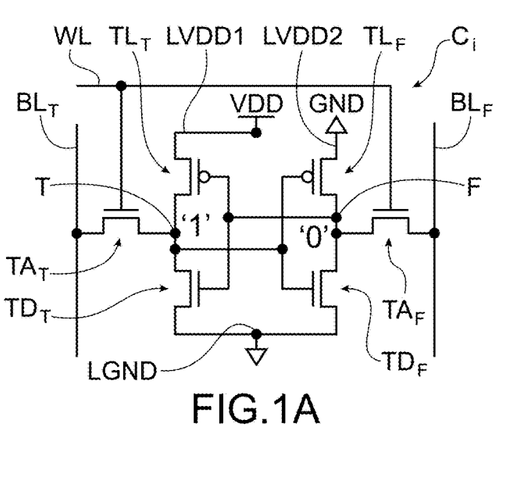
FIGS. 1A-1B give a wiring diagram equivalent of a first memory cell belonging to a memory plane of a memory device according to the invention during two consecutive phases during which, by means of supply lines of the inverters and of signals applied to said lines, logic information is pre-loaded in the first cell before giving same a readable and writeable SRAM cell functionality.
Figure 1B:
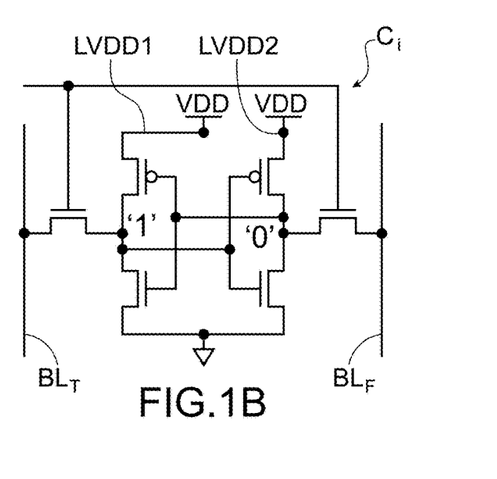
Figure 2:
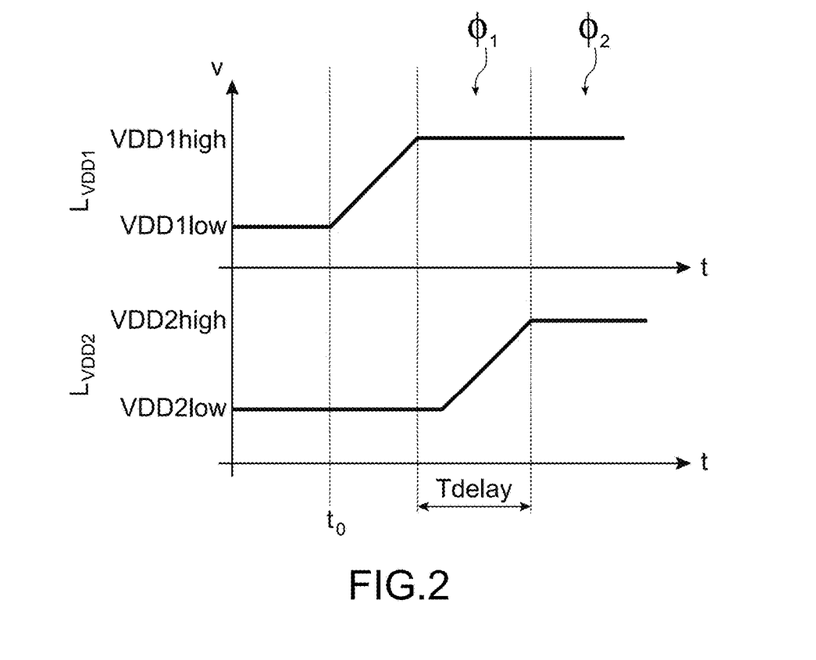
FIG. 2 gives an example of chronogram of voltages likely to be applied to a first supply line and to a second supply line of the inverters of a memory cell during the aforementioned two consecutive phases.

Reference is at present made to FIGS. 1A-1B, and 2 that are used to illustrate various phases of an initialisation sequence of a basic memory cell $C_i$ of a memory device such as implemented according to one embodiment of the present invention. During said initialisation sequence, logic information is pre-loaded and imposed on said cell $C_i$. Said logic information or data corresponds to a ROM memory data.

The memory cell $C_i$ shown has a SRAM memory structure and is thus provided with two nodes T and F, provided to keep logic information in the form of a first logic data, and of an additional second logic data of the first data. The logic data is kept in the nodes T, F by the transistors $TL_T$, $TL_F$, $TD_T$, $TD_F$ forming the inverters looped thereon, that is to say mounted in antiparallel or top-to-tail. Thus, the first inverter is provided with an input connected to the first node and to an output of another inverter, the first inverter further having an output connected to the second node and to an input of the other inverter. Said other inverter is therefore provided with an input connected to the second node and with an output connected to the first node.

In the example of embodiment illustrated, the SRAM cell has a structure of type commonly called "6T" and thus includes 6 transistors, the two inverters then being produced by two load transistors $TL_T$, $TL_F$, in this example of PMOS type, and also called "pull up", and two conduction transistors, in this example of NMOS type and also called "pull down". The transistors $TL_T$, $TD_T$, form one side of the cell, whereas the transistors $TL_F$, $TD_F$, form here another side of the cell.

The cell $C_i$ is also provided with two access transistors $TA_T$ and $TA_F$ having a conventional arrangement. The access transistors $TA_T$ and $TA_F$ are connected respectively to so-called bit lines $BL_T$ and $BL_F$ generally shared by the SRAM cells of a same column of cells of a matrix plane consisting of cells arranged in lines (horizontal rows) and in columns (vertical rows). The access to the nodes T and F is controlled by a word line WL generally shared by some or the SRAM cells of a same line (horizontal row) of cells of the matrix plane. The access transistors $TA_T$ and $TA_F$ are thus provided to enable the access or block the access respectively to the first node T and to the second node F.

In the example of embodiment illustrated, the cell Ci has the specific feature of having the first inverter thereof and the second inverter that are not connected to a same supply line but connected respectively to a first supply line LVDD1 and to a second supply line LVDD2 distinct from the first supply line LVDD1. The supply lines LVDD1, LVDD2 are likely to be set at potentials different from one another.

In said specific example of embodiment, a first load transistor $TL_T$ here of PMOS type is connected to the first supply line LVDD1 whereas a second load transistor $TL_F$ is connected to the second supply line LVDD2, said transistors $TL_T$, $TL_F$ thus being able to be polarized differently from one another, whereas the conduction transistors $TD_T$, $TD_F$, in particular of NMOS type are for their part connected to a same line LGND, which may be set, for example, at a reference or ground potential GND.

During a first phase Φ1 of an initialisation sequence (FIG. 1A, and chronogram of FIG. 2), a first potential VDD1high, in this example equal to the supply voltage VDD, is applied to the first supply line LVDD1, whereas a second potential VDD2low different from the first potential, in this example equal to the ground potential GND, is applied to the second supply line LVDD2.

The application of said pair of different potentials results in an asymmetrical biasing of the load transistors of the inverters in relation to one another. An asymmetrical or unbalanced supply of one side of the cell in relation to the other makes it possible to impose on the nodes T, F the pre-load values. The pre-load logic data is then imposed on the nodes T, F without calling on the bit lines that are usually used to write or read a data when the cell $C_i$ is in the normal operating mode thereof, in other words same of a conventional SRAM.

The cell Ci is initialised during the first phase Φ1 as a ROM memory cell. The pair of potentials VDD, GND applied respectively to the first line LVDD1 and LVDD2 results in, in this example, a pre-load of the two nodes T and F, respectively at a logic level '1' and at the additional logic level '0'. Logic information is thus pre-loaded into the cell $C_i$, and the value thereof depends on the manner in which the cell Ci is connected to the supply lines LVDD1, LVDD2 and on the pair of potentials applied to same during the first phase.

Advantageously, the first phase during which the cell $C_i$ is initialised and pre-loaded, is consecutive to a powering on of the memory device (powering on occurring in the example of chronogram given in FIG. 3 at an instant $t_0$).

In this case, if reference is made to the example given previously, the powering on of the memory device results in a setting at the supply potential VDD of the first supply line LVDD1 whereas the second supply line LVDD2 is not supplied and left at the ground potential GND during the first phase.

According to a second phase Φ2 (FIG. 1B and chronogram in FIG. 2), it is established a symmetrical supply of the load transistors of the inverters. For this, the pair of potentials applied respectively to the first supply line LVDD1 and to the second supply line LVDD2 is modified.

For said second phase, it is kept, for example, a potential VDD1high equal to the supply potential VDD on the first line LVDD1 whereas on the second supply line LVDD2, a higher potential VDD2high than same provided for the first phase is applied. The second supply line LVDD2 is, for example, set at the supply potential VDD, even though the load transistors $TL_T$ and $TL_F$ have the sources thereof at the same potential, as is the case for a conventional SRAM cell.

Thus, during the second phase, the cell Ci keeps the pre-loaded logic data imposed during the first phase whilst becoming, via a balanced or symmetrical supply between the two sides of the cell, equivalent to a SRAM cell then readable and writeable.

When the first phase Φ1 results in a powering on of the memory device, the second phase Φ2 during which the cell Ci becomes readable and writeable may be implemented by a delayed powering on of the second supply line LVDD2 according to a predetermined delay $T_{delay}$.

Examples of embodiment of a circuit for applying the potentials to the lines LVDD1, LVDD2 during the various phases of the aforementioned initialisation sequence, and in particular making such a delayed powering on possible, will be given later.

Figure 3A:
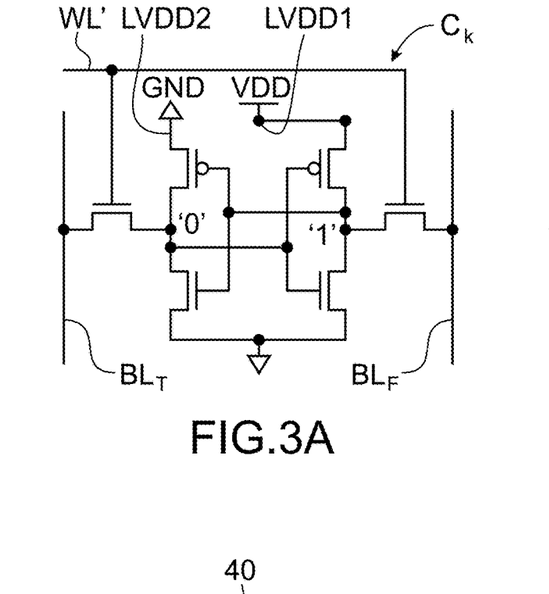
FIGS. 3A-3B give a wiring diagram equivalent of another memory cell of the same device as the first and during the two same consecutive phases, said other cell having a connection to the supply lines of the different inverters of same of the first in order to pre-load logic information different from same pre-loaded in the first cell.
Figure 3B:
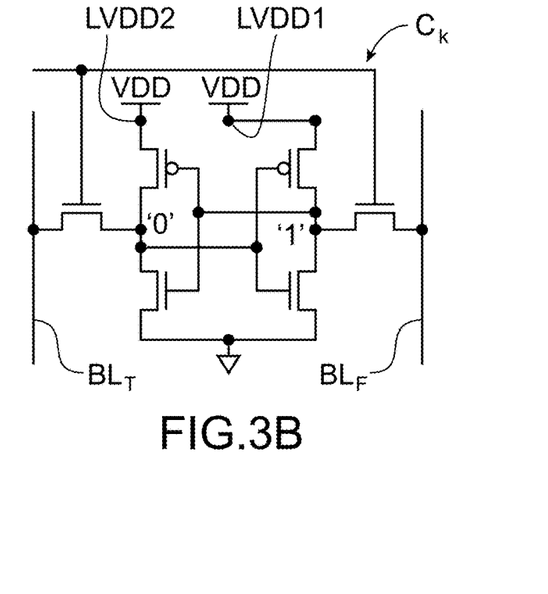

FIGS. 3A-3B are used to illustrate the operation of another basic cell $C_k$ of the memory device during the same first phase Φ1 and second phase Φ2 of the initialisation sequence.

Said other cell $C_k$ belonging to the same matrix arrangement as the cell $C_i$, and in particular to the same column of cells of the cell Ci, differ from the cell Ci due to the connection thereof to the supply lines LVDD1 and LVDD2.

In this example, the first inverter and the second inverter of the cell $C_k$, are connected respectively this time to the second supply line LVDD2 and to the first supply line LVDD1. Thus, the source of the first load transistor $TL_T$ is connected to the second supply line LVDD2 whereas the source of the load transistor $TL_F$ is connected to the first supply line LVDD1.

If the example of biasing of the supply lines LVDD1, LVDD2 previously described for the first phase is followed, potentials VDD and GND are applied respectively to the first line LVDD1 and the second supply line LVDD2. This results in a setting of the two storage nodes T and F of the cell $C_k$, respectively at a logic level '0' and at the logic level '1' fixed. During the first phase (FIG. 3A), the cell $C_k$ is thus also pre-loaded as a ROM memory cell, but, due to the different connection thereof relatively to the supply lines LVDD1, LVDD2, stores different logic information and in particular additional to same of the cell $C_i$ at the nodes T, F thereof.

During the second phase $\Phi 2$ (FIG. 3B), the cell $C_k$ is set in a SRAM memory operating mode, in so far as the potentials applied respectively to the first supply line LVDD1 and to the second supply line LVDD2 are preferably equal, for example at VDD, and that a symmetry of supply is obtained between the two sides of the cell for making same both readable and writeable.

The operating mode of the cells $C_i$, $C_k$ previously described may make it possible to implement a memory device operating such as a pre-loaded SRAM with ROM memory data thanks to an initialisation sequence. It is then possible to read the data stored by said cells Ci, Ck. Said data are, for example, data relative to a boot program required, for example, by a processor during the start-up or re-initialisation of a digital system.

The supply lines LVDD1, LVDD2 make it possible in particular to initialise the first cell $C_i$ and to impose thereon outside of the conventional SRAM operating mode, and in particular prior to said SRAM operating mode, a pre-load logic data. The value of said initialisation logic data depends on the signals applied to the supply lines and for a given pair of signals, on the manner in which the cell $C_i$ is connected to the supply lines. The value of said logic data imposed during the aforementioned initialisation sequence may thus be determined from the design of the device. The logic data imposed during the initialisation sequence thus constitutes a ROM memory data. All of the ROM memory data or ROM memory code may then be determined by the designer of the device when same chooses, at the time of the design, the manner in which each cell is arranged in relation to the supply lines LVDD1 and LVDD2.

Figure 4:
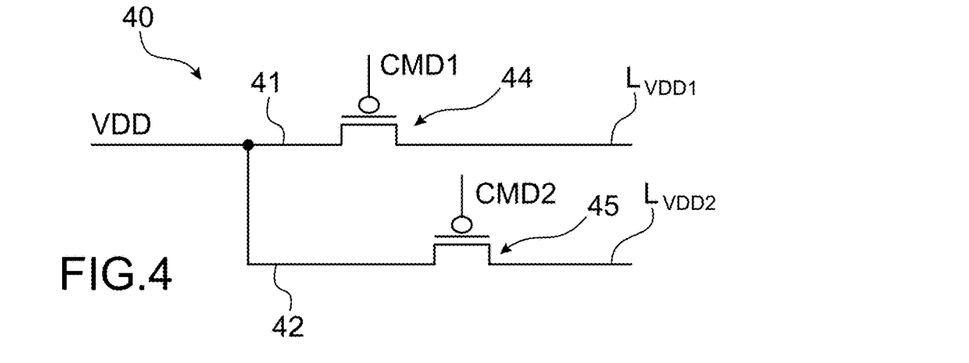
FIGS. 4, 5, 6 respectively give a first example, a second example, and a third example of embodiment of a circuit for applying a sequence of supply voltages to the first and second supply lines during the two aforementioned phases.

A specific example of embodiment of a circuit configured for applying different pairs of potentials to the supply lines LVDD1 and LVDD2 and for changing from said first phase to said second phase previously mentioned, is illustrated in FIG. 4.

In particular, said circuit 40 makes it possible to produce a delayed powering on of one of the supply lines in relation to the other, in this example of the second supply line LVDD2 in relation to the supply line LVDD1. The circuit comprises a first portion 41 and a second portion 42 connected to one another and to a node receiving a supply voltage VDD. A switch element controlled by a control signal CMD1, is disposed between the first portion 41 and the first supply line LVDD1, whereas another switch element, controlled by a control signal CMD2, is arranged between the second portion 42 and the second supply line LVDD2.

The switch elements are, for example, transistors 44, 45 the respective gates of which receive respectively the first control signal CMD1 and the second control signal CMD2. A change of state of the first control signal CMD1 makes it possible to connect the first portion 41 to the first supply line LVDD1 (initialisation of the pre-loaded values), the first supply line LVDD1 receiving the supply voltage VDD. Then (second phase), a change of state of the second control signal CMD2 delayed according to a predetermined delay in relation to the first control signal CMD1 makes it possible to connect second portion 42 to the first supply line LVDD2, the first supply line LVDD1 and the second supply line then both receiving the supply voltage VDD.

Figure 5:
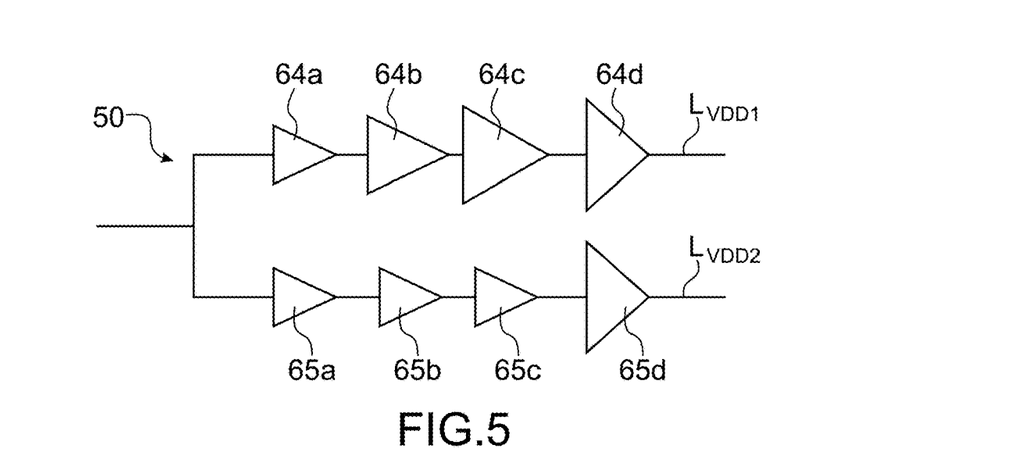

A second example of circuit 50 for performing an offset powering on between the two supply lines LVDD1, LVDD2 is illustrated in FIG. 5.

Between one portion 51 of circuit connected to a node suitable for receiving a supply voltage VDD and the first supply line LVDD1, it is provided one or more buffers also called separator amplifiers. Between another portion 54 suitable for receiving the supply voltage VDD and the second supply line LVDD2, it is also disposed one or more buffers 55a, 55b, 55c, 55d.

Preferably, it is provided the overall current gain of the buffer or buffers 55a, 55b, 55c, 55d provided between the portion 54 and the second supply line LVDD2, lower than the overall gain of the buffer or buffers 54a, 54b, 54c, 54d in order to induce a greater delay in transmission of VDD on the supply line LVDD2 in relation to the delay induced by the buffers 54a, 54b, 54c, 54d for transmitting VDD on the supply line LVDD1.

Figure 6:
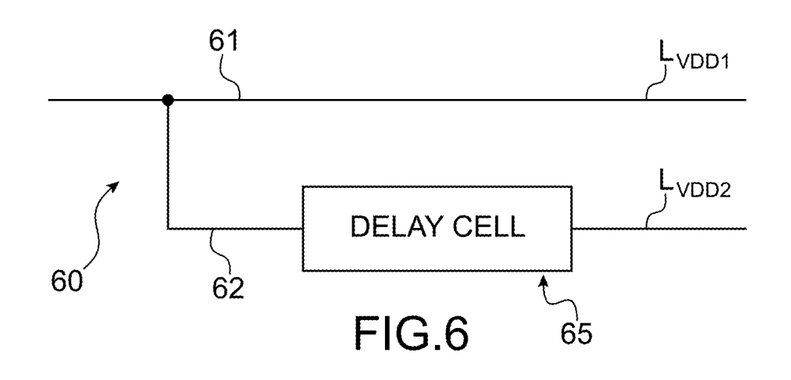
Figure 7A:
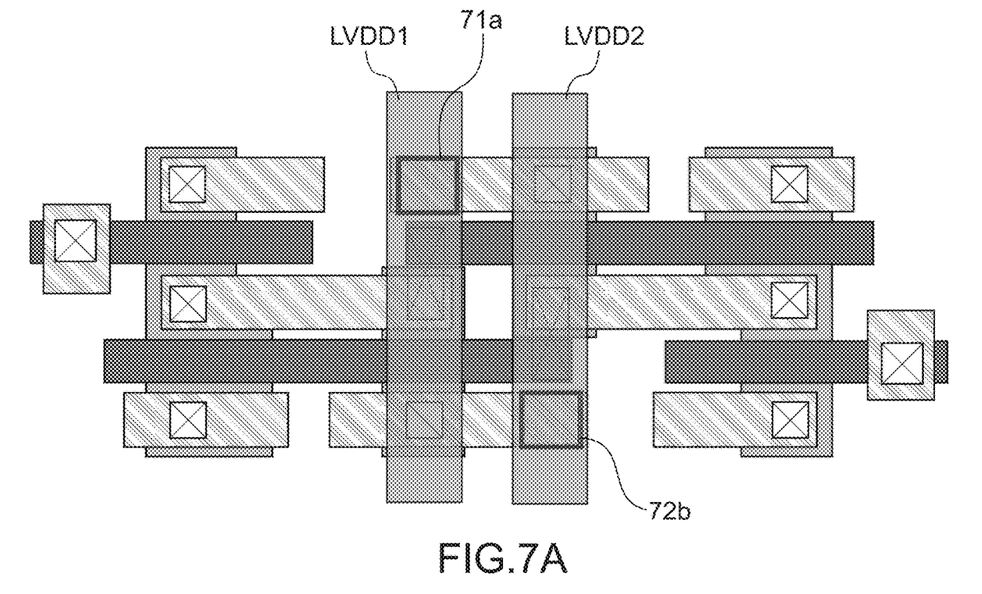
FIGS. 7A-7D are used to illustrate possible configurations of connections of a cell to the first supply line and to the second supply line.
Figure 7B:
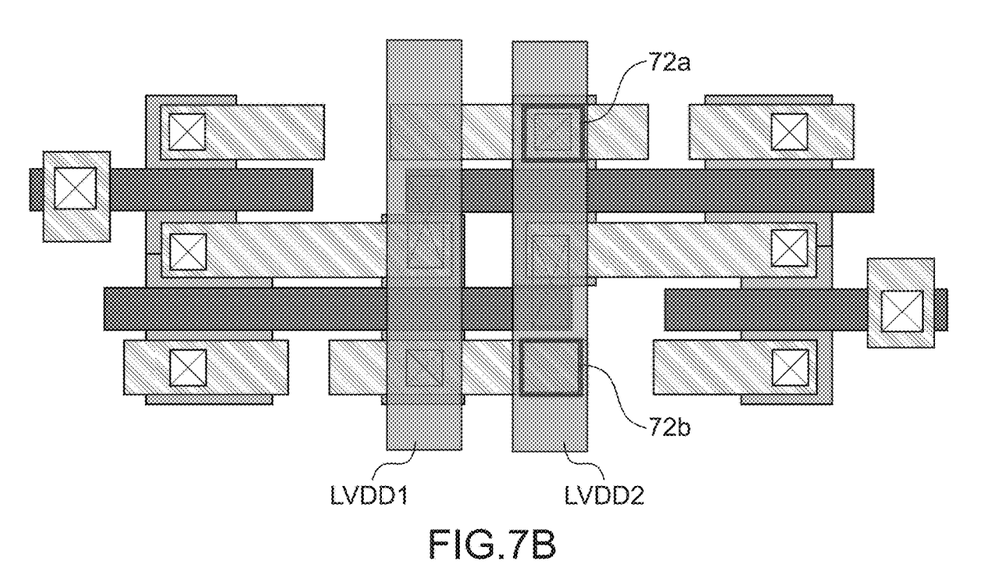
Figure 7C:
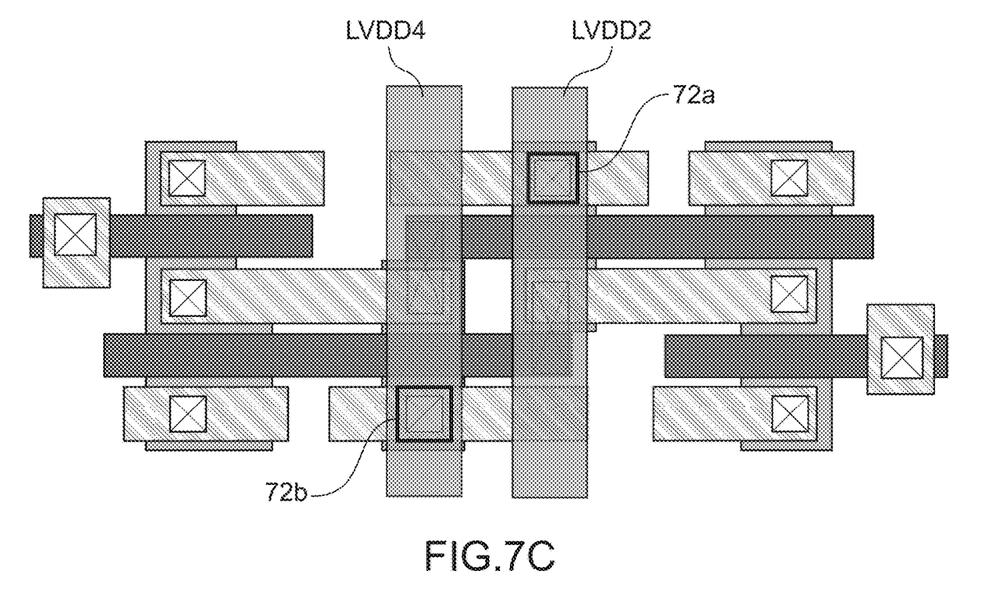
Figure 7D:
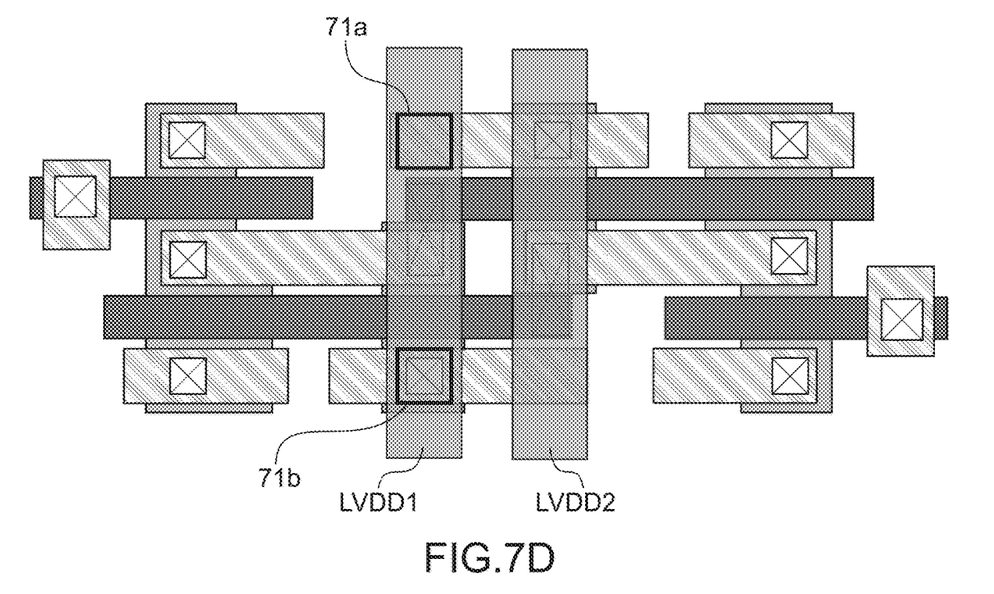

A third example of circuit 60 for a delayed powering on between the first supply line LVDD1 and the second supply line LVDD2 is shown schematically in FIG. 6.

Said circuit comprises a first portion 61 connected to the first supply line LVDD1 and to a node suitable for receiving a voltage supply VDD, A delay cell 65 is disposed between a second portion 62 of the circuit connected to said node and the second supply line LVDD2.

The supply lines LVDD1 and LVDD2 are typically shared by the cells of a same column of cells, that is to say of cells also typically sharing a same pair of bit lines $BL_T$ and $BL_F$.

In order to implement a dissociated biasing or supply of the transistors $TL_T$ and $TL_F$, it is provided the supply lines LVDD1 and LVDD2 typically in the form of distinct metallic lines and that extend in a metallic level of interconnections situated above the transistors.

The load transistors $TL_T$ and $TL_F$ are connected respectively to one of the two supply lines LVDD1 and LVDD2 and to the other of the two supply lines by means of vias type conductive elements.

For a given memory cell, the placement of the vias for establishing a connection between the transistors $TL_T$ and $TL_F$ respectively with one or other of the supply lines LVDD1 or LVDD2 determines the value of the data that it is desired to pre-load into said cell.

Thus, the cell Ci previously described, has transistors $TL_T$, $TL_F$ of which the connections to the supply lines LVDD1, LVDD2 are arranged differently from same of the transistors $TL_T$, $TL_F$ of the cell $C_k$ which makes it possible to store different data between the cell $C_i$ and the cell $C_k$.

FIGS. 7A-7D are used to illustrate a specific example of embodiment wherein it can be provided to produce the supply lines LVDD1, LVDD2 from a $2^{nd}$ metallic level again called "metal 2". Various possible configurations of the vias 71a, 71b, 72a, 72b, which extend between a first metal level and the second level are given in said figures, a first load transistor being able to be connected either to the first supply line by means of a via 71a or even to the second supply line by means of a via 72a, whereas the other load transistor may be connected either to the first supply line by means of a via 71b or even to the second supply line by means of a via 72b.

However, such an arrangement is not in keeping with all manufacturing technologies.

Figure 8A:
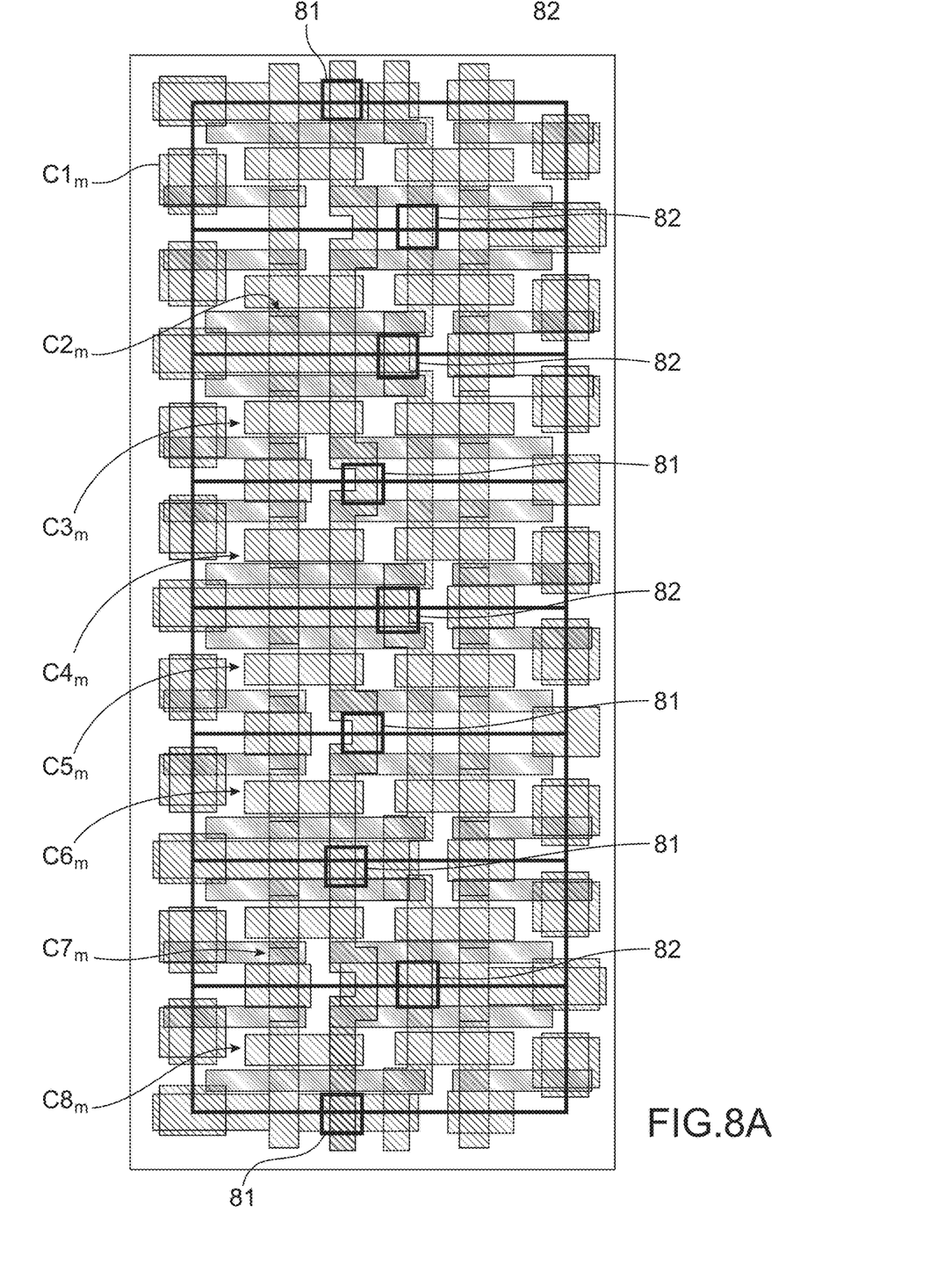
FIGS. 8A-8B give an example of specific arrangement of memory cells in a column of a memory device wherein one cell out of two of the column is pre-loadable in order to be readable such as a ROM, then subsequently rewriteable, whereas the other cells adopt a conventional SRAM cell operation.
Figure 8B:
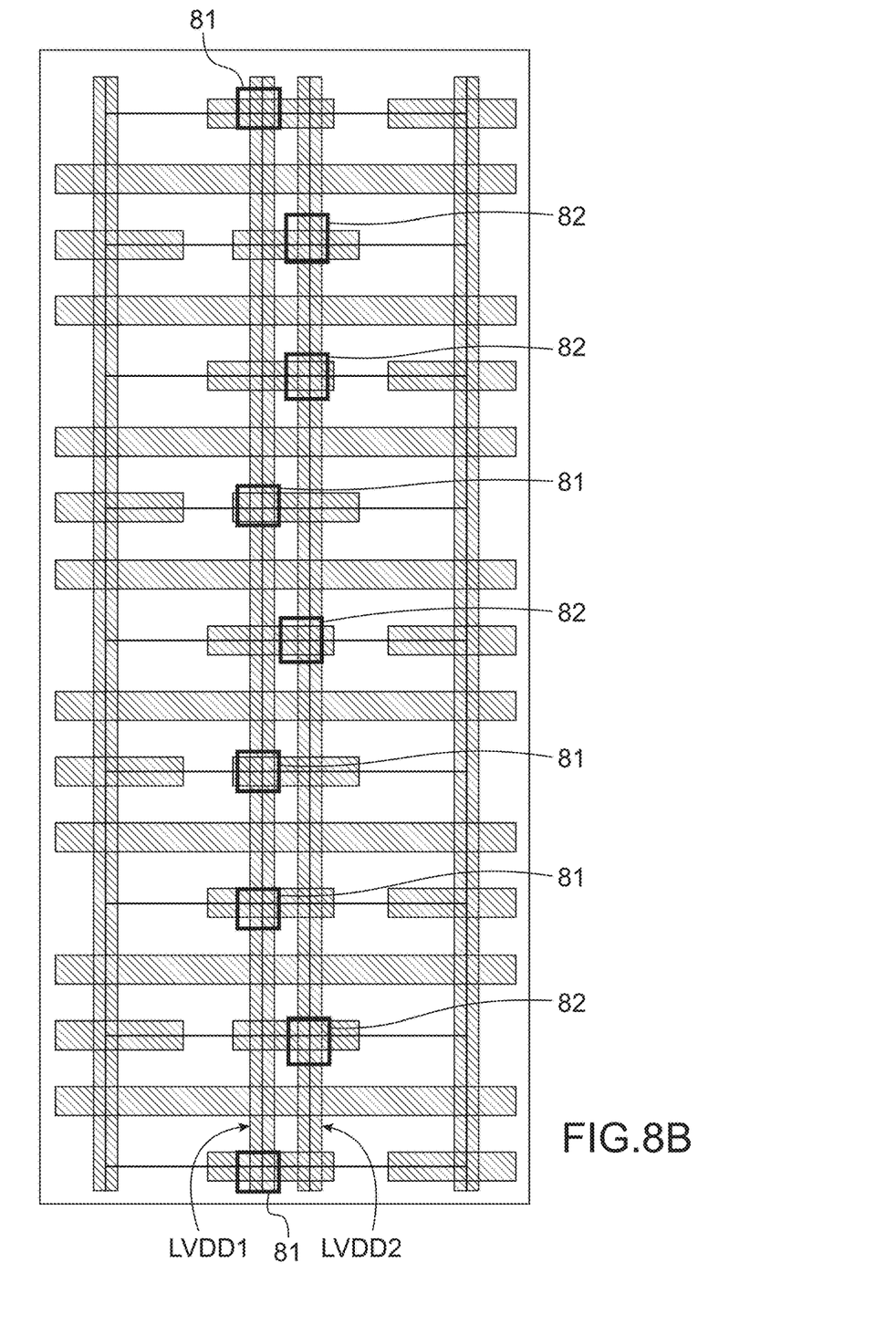

Thus, another type of arrangement, more compatible with conventional manufacturing technologies, is proposed in the example of embodiment illustrated in FIGS. 8A-8B, with the supply lines LVDD1, LVDD2 that extend in a higher metallic level for example in a third level and a fourth metallic level including, for example, four metallic levels.

On said figures a set of 8 basic memory cells $C_{1m}$, $C_{2m}$, $C_{3m}$, $C_{4m}$, $C_{5m}$, $C_{6m}$ $C_{7m}$, $C_{gm}$ neighbouring and belonging to different lines (horizontal rows) and belonging to a same column m of cells are shown.

The cells $C_{1m}$, $C_{2m}$, $C_{3m}$, $C_{4m}$, $C_{5m}$, $C_{6m}$ $C_{7m}$, $C_{gm}$ are thus typically addressed by different word lines but are connected to a same pair of bit lines.

In this example, a specific arrangement of the connections to the supply lines LVDD1 and LVDD2 is also provided, each cell sharing a common connection area 81 or 82 with one of the supply lines LVDD1 and LVDD2 with a neighbouring cell of a greater horizontal row, and another common connection area 81 or 82 with one line of the supply lines LVDD1 and LVDD2 with another neighbouring cell of a lower horizontal row. Such an arrangement makes it possible to reduce the size of the metallic lines and associated vias.

In this specific example, the cells $C_{1m}$, $C_{3m}$, $C_{5m}$, $C_{7m}$, of odd horizontal rows are provided with a connection area 81 to the first supply line LVDD1 and another connection area 82 to the second supply line LVDD2. The cells $C_{2m}$, $C_{4m}$, $C_{6m}$, $C_{8m}$, of even horizontal rows are provided with either two connection areas 81 or 82 to the same supply line LVDD1 or LVDD2 or two connection areas 81, 82 connected to distinct supply lines LVDD1, LVDD2. With such an arrangement, the cells $C_{1m}$, $C_{3m}$, $C_{5m}$, $C_{7m}$, of the odd rows are capable of being pre-loaded during the first phase resulting from the powering on of the memory. The cells $C_{1m}$, $C_{3m}$, $C_{5m}$, $C_{7m}$ are likely to form a ROM memory the data of which correspond to the values pre-loaded during the first phase previously mentioned.

As previously suggested, the data pre-loaded by the cells $C_{1m}$, $C_{3m}$, $C_{5m}$, $C_{7m}$ depend on the respective arrangements of the connections of the inverters thereof to the supply line LVDD1 and to the other supply line LVDD2.

The cells $C_{1m}$, $C_{7m}$ have similar arrangements in relation to one another of the connections 81, 82 thereof respectively between the first inverter thereof and the first supply line LVDD1 and between the second inverter thereof and the second supply line LVDD2. Thus, said cells $C_{1m}$, $C_{7m}$ make it possible to store a same logic data, for example a '1' at the first node T thereof or a '0' at the additional node F thereof.

The cells $C_{3m}$, $C_{5m}$ have arrangements of the connection areas 81, 82 thereof different to same of the cells $C_{1m}$, $C_{7m}$, but mutually similar. Thus, the connections 82, 81 thereof are this time respectively between the first inverter thereof and the first supply line LVDD1 and between the second inverter thereof and the second supply line LVDD2. Said cells $C_{3m}$, $C_{5m}$ make it possible to store a same logic data, for example a '0' at the first node T thereof or a '1' at the second node F thereof.

In the example illustrated, the cells $C_{2m}$, $C_{6m}$ are in a metastable state during the first biasing phase of the lines LVDD1 and LVDD2 due to the connection thereof to a same supply line, whereas the respective connections of the cells $C_{3m}$, $C_{7m}$ impose, for example, a logic data, for example, a '0' at the first node T of the cell $C_{3m}$ and a logic data, for example, a '1' at the first node T of the cell $C_{7m}$. However, the cells $C_{2m}$, $C_{4m}$, $C_{6m}$, $C_{8m}$, are not used as ROM memory cells during the operation where it is desired to access the data of the ROM memory. Due to the fact that same share a common connection area with the respective neighbouring cells thereof, said cells $C_{2m}$, $C_{4m}$, $C_{6m}$, $C_{8m}$ are therefore during the initialisation sequence, in a state imposed by same of the respective neighbouring cells thereof, the cells $C_{2m}$, $C_{4m}$, $C_{6m}$, $C_{8m}$, and will not be subject to a read access during a so-called boot phase of the circuit, during which the pre-loaded data are read.

Therefore, there is a memory device of which one line (horizontal row) out of two is used during a boot of the circuit. Alternatively, it can be provided an arrangement wherein there is only access to the cells of even rows.

Subsequently, during the second phase, the supply lines LVDD1 and LVDD2 are set at the same potential and the set of cells $C_{1m}$, $C_{3m}$, $C_{5m}$, $C_{7m}$, $C_{2m}$, $C_{4m}$, $C_{6m}$, $C_{8m}$ finds a biasing, with a balanced supply of the two sides of each cell making it possible for same to operate as a conventional SRAM.

Therefore, there is a memory device of which all of the lines (horizontal rows) are likely to be used once that ROM memory data pre-loaded during the initialisation have been read.

It should be noted that in said configuration, given that two neighbouring memory cells (for example $C_{1m}$, $C_{2m}$) share a common connection area with one of the first and second supply lines (area 82 coupled to LVDD2), it is therefore possible to choose the pre-load value that will be imposed on one of the two neighbouring memory cells (for example CA by choosing the supply line (LVDD1 in FIG. 8B) that will be coupled to the first transistor of the first inverter of said cell, the other supply line being coupled to the second transistor of the second inverter. For the other of the two neighbouring memory cells (for example $C_{2m}$), the first transistor of the first inverter and the second transistor of the second inverter of said other of the two neighbouring memory cells are both coupled to the supply line that is coupled to the first common connection area (as is the case for the cell $C_{2m}$ shown in FIG. 8B), which means that the pre-load value cannot be imposed for said other of the two neighbouring memory cells.

Alternatively, it would be possible that the first transistor of the first inverter and the second transistor of the second inverter of said other of the neighbouring memory cells are coupled to the two supply lines in a manner opposite to said one of the two neighbouring memory cells (the common connection area 82 with the cells $C_{2m}$ and $C_{3m}$ would be coupled to LVDD1), which means that the pre-load value imposed for the cell $C_{2m}$ is not chosen independently of same chosen for said one of the two neighbouring memory cells.

Figure 9A:
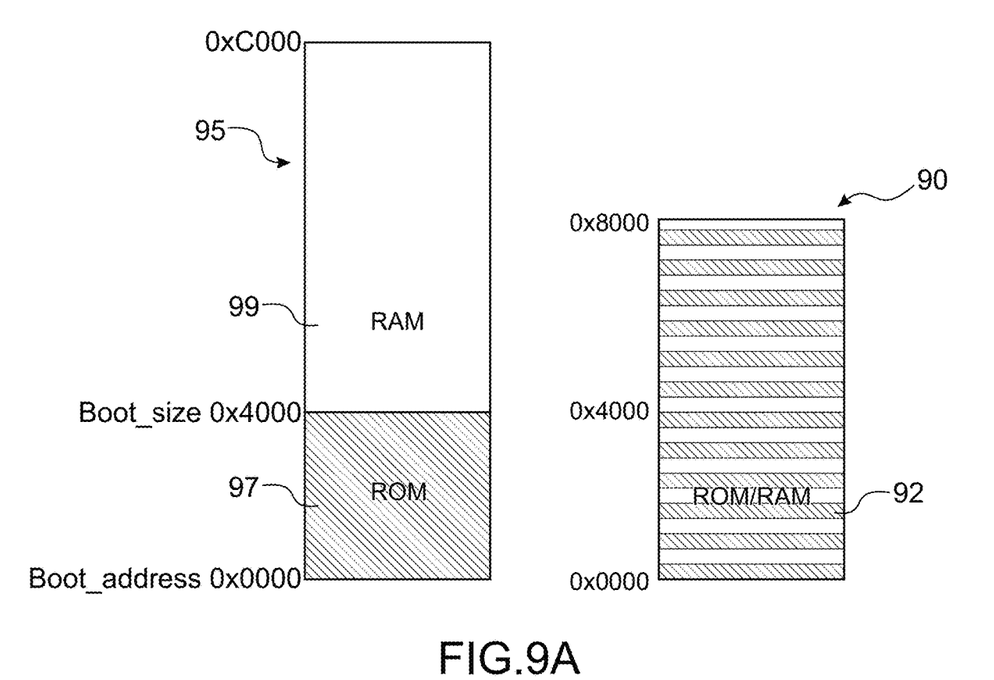
FIGS. 9A-9B are used to illustrate an example of correspondence between a set of virtual addresses relative to a RAM memory, and a physical memory such as implemented according to one embodiment of the present invention including a sector of SRAM cells and a sector of SRAM cells some of which are pre-loadable such as the ROM memory cells.

FIG. 9A illustrates schematically a physical memory 90 that includes a sector 92 of memory cells producing a RAM memory with one line out of two pre-loaded with a boot code.

The sector 92 for example consists of a set of cells such as implemented according to the invention and having an arrangement of the type of same previously described in particular in relation to FIGS. 8A-8B. Thus, in said sector 92 one horizontal row (line) of cells out of two, for example the even horizontal rows (or the odd horizontal rows), includes pre-loaded cells that can be used as ROM memory during the so-called boot phase then as, whereas the cells of the odd rows (or respectively the cells of the even rows) contain the values imposed by the neighbouring cells that are not used during the boot phase.

In said FIG. 9A, the block 95 shows a set of virtual addresses seen by a processor or by a central processing unit required to exploit the data of the physical memory 90 and belonging to a digital processing system.

The processor may be required, during a first memory access, corresponding for example to a start-up or boot phase of the system, to exploit or read the program data, in particular, of a boot program stored in the physical memory 90 and corresponding to the cells of the sector 92. Thus, it is likely to access, for example, the cells $C_{1m}$, $C_{3m}$, $C_{5m}$, $C_{7m}$ in FIGS. 8A-8B.

The processor may subsequently be required, during a second memory access, to exploit the RAM memory data stored in the sector 92. Cells of the sector 92 of the physical memory 90, which have been read during the first access are thus also likely to be read and re-written during the second access. If reference is made to the example of arrangement previously described in relation to FIGS. 8A-8B, the cells $C_{1m}$, $C_{3m}$, $C_{5m}$, $C_{7m}$ may be read during an access to the ROM memory then during an access to the RAM memory.

Figure 9B:
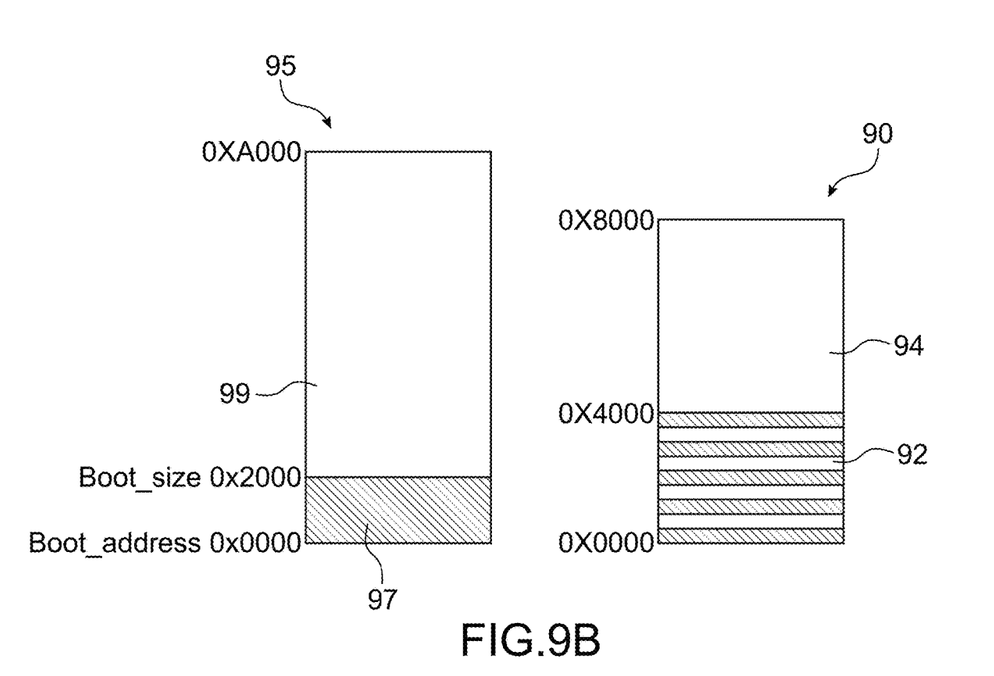

In the example of embodiment in FIG. 9B, the physical memory includes, further the sector 92, another sector 94 consisting of SRAM cells with conventional operation. The sector 94 consists of cells that operate as one of the conventional type SRAM cells. The sector 94 for example consists of cells having an arrangement of the type of the cell $C_{2m}$ previously described in relation to FIGS. 8A-8B, or even an arrangement of the transistors that differs from same of the cells in FIGS. 1A-1B, 2A-2B, in that the load transistors $TL_T$, $TL_F$ thereof are both connected to a same supply line, for example LVDD1 or LVVD2.

The processor may be required, during a first memory access, corresponding for example to a start-up or boot phase of the system, to exploit or read the program data, corresponding to the cells of the sector 92.

The processor may subsequently be required, during a second memory access, to exploit the RAM memory data stored either in the sector 92 or in the sector 94.

A differentiation between an access to the ROM memory and an access to the RAM memory is produced by virtual address decoding during the receipt of a read/write access request. Said differentiation between access to the ROM memory and access to the RAM memory is operated using a virtual address management module for converting a virtual address into a physical address.

When the virtual address management module detects that an access to the RAM memory is required, same applies a given type of operation to a virtual address to produce a physical address corresponding to one of the two sectors 92, 94. Said type of operation may comprise an operation for subtracting an offset value from the virtual address.

When an access to the ROM memory is required, a different type of operation is implemented, in so far as same does not occupy all of the lines (horizontal rows) of the sector 92. Said type of operation may comprise an operation for subtracting another offset value as well as a shift, in order to produce a physical address corresponding, for example, only to an even or odd line of the physical memory 90.

When odd horizontal rows or lines of the physical memory meet the function of the ROM memory, a shift of 1 to the left and an insertion of '1' may make it possible, for example, to produce a physical address corresponding to an odd line.

Alternatively, when the ROM memory is produced by even horizontal rows or lines, a shift of 1 to the left and an insertion of '0' may, for example, make it possible to produce a physical address corresponding to an even line.

Figure 10A:
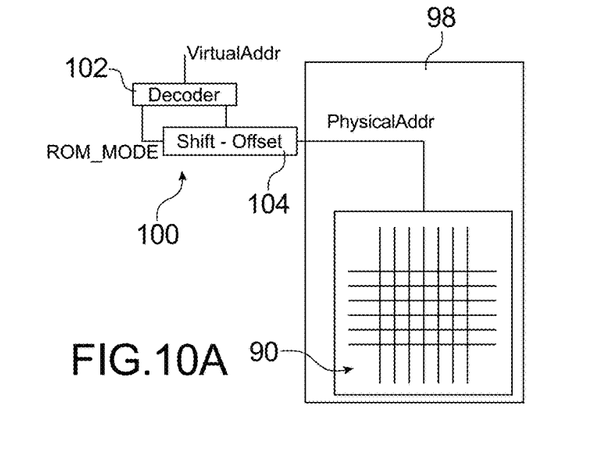
FIGS. 10A-10C give various examples of embodiment of a module for converting virtual memory addresses into physical addresses for a memory device such as implemented according to one embodiment of the present invention.
Figure 10B:
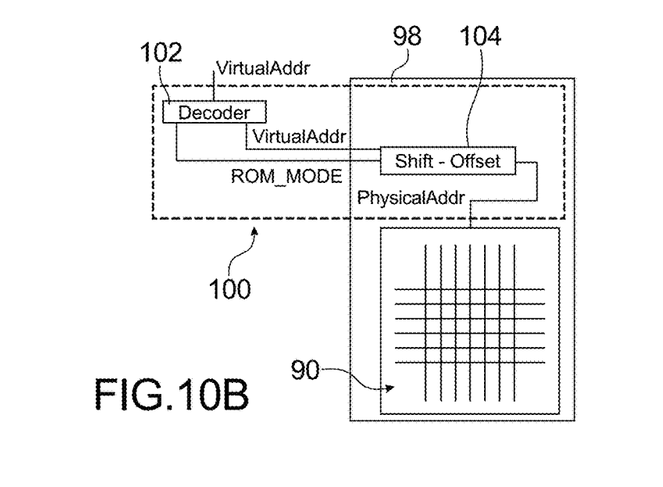
Figure 10C:
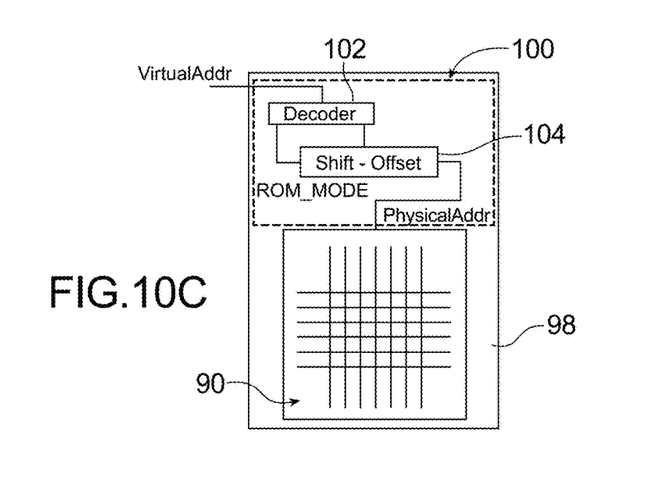

Various examples of an embodiment of a module 100 for converting a virtual address into a physical address are given in FIGS. 10A-10C.

Said figures are used to illustrate respectively:
  a first case wherein the module 100 is fully dissociated from a support 98 on which the physical memory 90 is found,
  a second case wherein the module 100 is partially located on the support 98 of the physical memory 90,
  a third case wherein the module 100 is fully integrated on the same support 98 as the physical memory 90.

In the second case, the memory support 98 can comprise a specific input signal for receiving a ROM_MODE indicator signal of a type of memory access produced on the physical memory between an access to the cells of said read-only memory or to the cells of said readable and writeable memory.

In the third case, the support 98 whereon the memory is can comprise a decoder 102, with this decoder 102 then typically having mapping information linked to the virtual memory 95 seen from the processor.

In the three cases, the module 100 is provided with a decoder 102 configured for, from a virtual address "VirtualAddr", emitting a memory access type ROM_MODE indicator signal between an access relative to the ROM memory and an access relative to the RAM memory. Said indicator signal is different depending on whether an access to the ROM memory or to the RAM memory is required. The decoder 102 may use for this a "boot_size" data related to the size of the space reserved for the ROM memory 97.

The decoder 102 is configured to transmit the memory access type indicator signal and transmit the virtual address to an offset module 104 responsible for applying a so-called "offset" type of operation to the virtual address and consequently produce a physical address "PhysicalAddr" resulting from said operation. The type of operation performed by the offset module 104 is different depending on whether the memory access type indicator signal received by the offset module 104 indicates an access to the ROM memory or an access to the RAM memory.

An example of use of such a device in a digital system, including a processor, for example a Graphics Processing Unit or GPU or a Digital Signal Processor (DSP) is the following:

After powering on of the digital system or start-up of the digital system, some cells of the sector 92, in particular the cells of even rows (or even the cells of odd rows), are pre-loaded via the first biasing phase of the lines LVDD1, LVDD2, and the data of the ROM memory (sector 97 seen by the processor of the virtual memory 95) may be accessed by emitting requests including the virtual addresses, typically presented incrementally starting with an address, called "boot_address", for example OX0000.

The decoder 102 identifies from the virtual address the type of memory access required and in the present case detects an access to the ROM memory. A signal, for example, via the ROM_MODE input kept at the same potential indicates to the offset module 104 an access to the ROM memory. Said module 104 produces an operation on the virtual address so as to generate a physical address.

Advantageously, the operation performed is provided so as not to produce a physical address only giving access or corresponding to the odd rows of cells, or only giving access or corresponding to the even rows of cells. The operation performed is for example an offset of bits to the left and addition of a '1' when the ROM memory cells are same of the odd rows of the sector 92, or an offset of bits to the left and an addition of '0' when the ROM memory cells are same of the even rows of the sector 92.

The data of the RAM memory (sector 99 seen by the processor) may then be accessed by starting with an address, situated at boot_address+boot_size (boot_size corresponding to the ROM memory size) corresponding, for example, to 0X2000.

The decoder 102 identifies from the virtual address the type of memory access required and in the present case detects an access to the RAM memory. A signal for example via a change of polarity on the ROM_MODE input indicates to the module 104 an access to the RAM memory. Said module 104 then produces an operation, for example, by performing a "boot_size" subtraction operation on the virtual address. Said operation is therefore of a type different from same of the first phase. During an access to the virtual sector 99, there is therefore no offset, just a subtraction.

The invention claimed is:

1. A memory device provided with:
   a set of memory cells, each memory cell of said set comprising:
   a first node and a second node,
   a first inverter and a second inverter connected in a manner crossed between said first node and said second node,
   the memory device further comprising:
   a first supply line connected to one of a first transistor of the first inverter and a second transistor of the second inverter,
   a second supply line connected to the other of said first transistor of the first inverter and said second transistor of the second inverter, the second supply line being distinct from the first supply line,
   the memory device being provided with a circuit configured for, during an initialisation sequence:
   during a first phase, applying a first pair of potentials, respectively to the first supply line and the second supply line, so as to impose on the cells of said set, pre-load logic data the respective values of which depend on the supply line of said first and second supply lines to which the first transistor thereof and the second transistor thereof are respectively connected, then
   during a second phase, applying a second pair of potentials respectively to said first supply line and the second supply line, the second pair of potentials being different from the first pair of potentials and provided so as to keep said pre-load logic data and make the cells of said set readable and writeable,
   and wherein two neighbouring memory cells of said set share a first common connection area with one of said first supply line or second supply line that is chosen according to the desired value of the pre-load logic data to be imposed on one of the two neighbouring memory cells of said set during the first phase of the initialisation sequence.

2. The memory device according to claim 1, at least one first cell of said set having the first inverter thereof connected to the first supply line and the second inverter thereof connected to the second supply line,
   at least one other cell of said set having the two inverters thereof connected to the same given supply line from said first supply line and second supply line or having the first inverter thereof connected to the second supply line and the second inverter thereof connected to the first supply line.

3. The memory device according to claim 2, wherein said at least one other cell of said set corresponding to the other of the two neighbouring memory cells.

4. The memory device according to claim 1, wherein the second cell has the two inverters thereof connected to the same supply line via said first common connection area.

5. The memory device according to claim 1, wherein said set of cells includes at least one third cell situated on a same column of cells as the first cell and the second cell so that the second cell is situated between the first cell and the third cell, the third cell having one of the inverters thereof connected to the first supply line and another of the inverters thereof connected to the second supply line.

6. The memory device according to claim 5, wherein said third cell is neighbouring the second cell and shares with the second cell a second common connection area, the second cell being disposed between the first cell and the third cell, the second common connection area being connected to the first supply line when the first common connection area is connected to the first supply line or, the second common connection area being connected to the second supply line when the first common connection area is connected to the second supply line.

7. The memory device according to claim 6, wherein the first common connection area and the second common connection area are connected to the first supply line, said set being provided with at least one fourth cell disposed on a same column of cells as the first cell, the second cell and the third cell, the fourth cell having inverters connected to the second supply line.

8. The memory device according to claim 1, wherein said set of cells is a first set situated in a first sector of a matrix plane of cells, said matrix plane comprising a second sector provided with a second set of memory cells, said cells of said second sector being SRAM cells provided with inverters connected to a same supply line or receiving a same supply potential during the first phase and during the second phase of the initialisation sequence.

9. The memory device according to claim 1, wherein said set belongs to a matrix plane arranged in columns and in horizontal rows alternately odd and even of cells,
   wherein the first memory cell belongs to an odd horizontal row of cells and wherein said other cell of said set has the two inverters thereof connected to a same given supply line from said first supply line and second supply line and belongs to an even row of cells, or
   wherein the first memory cell belongs to an even horizontal row of cells and wherein said other cell of said set has the two inverters thereof connected to a same given supply line from said first supply line and second supply line and belongs to an odd row of cells.

10. The memory device according to claim 1, further comprising a module for converting virtual memory addresses into physical memory addresses, said conversion module being provided with an offset module configured for, following said initialisation sequence:
    detecting an indicator signal of a first type of memory access relative to an access to the read-only memory cells of said set, and to consequently apply a first type of operation to a virtual address in order to produce a physical address, then,
    detecting an indicator signal of a second type of memory access, relative to an access to the readable and writeable memory cells of said set, and to consequently apply a first type of offset operation to a virtual address in order to produce a physical address, the second type of operation being different from said first type of operation.

11. The memory device according to claim 10, wherein the first type of operation is provided so as to restrict the access only to the even horizontal rows from said horizontal rows of said set of cells or to restrict the access only to the odd horizontal rows from said horizontal rows of said set of cells, wherein the second type of operation is able to give access to all of the horizontal rows of said set of cells.

12. The memory device according to claim 10, wherein the conversion module includes a decoder configured for:
from a virtual address, producing an indicator signal of a first type of relative memory access or an indicator signal of a second type of memory access,
transmitting said virtual address to the offset module,
said set of cells, said offset module, and advantageously the decoder being disposed on a same support.

13. The memory device according to claim 1, wherein the first phase is consecutive to a powering on of the memory device, said circuit being configured for:
during the first phase, applying the first pair of potentials by powering on the first supply line, in particular so as to apply thereto a supply voltage VDD without supplying the second supply line, then, after a predetermined delay,
during the second phase, applying the second pair of potentials by keeping powered on the first supply line whilst powering on the second supply line, preferably with the same supply voltage VDD.

14. The memory device according to claim 13, wherein said circuit comprises:
a first portion and a second circuit portion each receiving a supply voltage VDD,
a first switch element between the first portion and the first supply line, suitable for alternately disconnecting then connecting the first circuit portion to the first supply line following a change of state of a first control signal,
a second switch element between the second portion and the second supply line, suitable for alternately disconnecting then connecting the second circuit portion to the second supply line following a change of state of a second control signal, the change of state of the second control signal being delayed in relation to the change of state of the first control signal according to said predetermined delay.

15. The memory device according to claim 13, wherein said circuit comprises:
a first portion and a second portion each receiving a supply voltage VDD,
at least one first buffer between the first portion and the first supply line,
at least one second buffer between the second portion and the second supply line, said first buffer having a current gain different from same of the second buffer.

16. The memory device according to claim 13, said circuit comprising:
a first portion connected to the first supply line and to a node receiving a voltage supply VDD,
a second portion connected to said node, at least one delay cell being disposed between the second portion and the second supply line.

* * * * *